(12) United States Patent
Kobayashi et al.

(10) Patent No.: US 9,251,903 B2
(45) Date of Patent: Feb. 2, 2016

(54) NONVOLATILE SEMICONDUCTOR MEMORY DEVICE AND CONTROL METHOD THEREOF

(71) Applicant: Kabushiki Kaisha Toshiba, Minato-ku (JP)

(72) Inventors: Takashi Kobayashi, Yokkaichi (JP); Eietsu Takahashi, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/458,430

(22) Filed: Aug. 13, 2014

(65) Prior Publication Data

US 2015/0262680 A1 Sep. 17, 2015

Related U.S. Application Data

(60) Provisional application No. 61/952,407, filed on Mar. 13, 2014.

(51) Int. Cl.
*G11C 16/04* (2006.01)
*G11C 16/10* (2006.01)
*G11C 16/34* (2006.01)

(52) U.S. Cl.
CPC ............ *G11C 16/10* (2013.01); *G11C 16/0483* (2013.01); *G11C 16/3459* (2013.01)

(58) Field of Classification Search
CPC .............................. G11C 16/08; G11C 16/0483
USPC ........................... 365/185.18, 185.23, 185.28
See application file for complete search history.

(56) References Cited

U.S. PATENT DOCUMENTS

| 5,990,514 | A | * | 11/1999 | Choi | G11C 16/0416 |
| | | | | | 257/315 |
| 7,489,553 | B2 | | 2/2009 | Mokhlesi | |
| 7,619,933 | B2 | * | 11/2009 | Sarin | G11C 16/3427 |
| | | | | | 365/185.02 |
| 7,839,687 | B2 | | 11/2010 | Dutta et al. | |
| 8,325,545 | B2 | | 12/2012 | Edahiro | |
| 8,335,114 | B2 | | 12/2012 | Shibata | |
| 8,456,918 | B2 | * | 6/2013 | Oh | G11C 16/10 |
| | | | | | 365/185.02 |
| 2007/0268749 | A1 | | 11/2007 | Kim et al. | |
| 2012/0218828 | A1 | * | 8/2012 | Oh et al. | 365/185.23 |
| 2013/0010541 | A1 | * | 1/2013 | Futatsuyama et al. | 365/185.22 |
| 2013/0343123 | A2 | * | 12/2013 | Kim | 365/185.02 |

FOREIGN PATENT DOCUMENTS

JP 2007-318138 12/2007
JP 2012-506103 3/2012
(Continued)

*Primary Examiner* — Son Mai
(74) *Attorney, Agent, or Firm* — Oblon, McClelland, Maier & Neustadt, L.L.P

(57) ABSTRACT

A nonvolatile semiconductor memory device includes: a memory cell array including a memory string having plural series-connected memory transistors; plural word lines disposed to be connected to the memory transistor in the memory string; plural bit lines electrically connected to an end of the memory string; and a control circuit. When performing a write operation on the memory cell array, the control circuit applies a first voltage to a selected word line selected from the plural word lines, applies a second voltage smaller than the first voltage to an unselected word line rendered unselected from the word lines. Before lowering a voltage applied to the unselected word line from the second voltage to a third voltage smaller than the second voltage, it lowers a voltage applied to the selected word line from the first voltage to a fourth voltage smaller than the first voltage.

14 Claims, 10 Drawing Sheets

(56) References Cited

FOREIGN PATENT DOCUMENTS

| JP | 2012-084207 | 4/2012 |
| JP | 5016108 | 9/2012 |
| JP | 2012-195051 | 10/2012 |

* cited by examiner

S101: Data Erase

S102: L Page Write

S103: U Page Write

NONVOLATILE SEMICONDUCTOR MEMORY DEVICE AND CONTROL METHOD THEREOF

CROSS REFERENCE TO RELATED APPLICATIONS

This application is based on and claims the benefit of priority from prior U.S. Provisional Patent Application No. 61/952,407, filed on Mar. 13, 2014, the entire contents of which are incorporated herein by reference.

BACKGROUND

1. Field

Embodiments described below relate to a nonvolatile semiconductor memory device and a control method thereof.

2. Description of the Related Art

A NAND type flash memory is known as a nonvolatile semiconductor memory device which is electrically rewritable and capable of being highly integrated. A memory cell of the NAND type flash memory includes a charge accumulation layer formed on a semiconductor substrate via a tunnel insulating film and a control gate stacked on the charge accumulation layer via an inter-gate insulating film. The memory cell stores data in a nonvolatile manner by a charge accumulation state of the charge accumulation layer.

In this NAND type flash memory, the memory cell deteriorates as the number of times of write operations and erase operations increases. As a result, there is a risk that it becomes impossible to write data accurately in the write operation of data.

DETAILED DESCRIPTION

A nonvolatile semiconductor memory device according to an embodiment comprises: a memory cell array including a memory string having a plurality of memory transistors connected in series therein; a plurality of word lines disposed to be connected to the memory transistor in the memory string; a plurality of bit lines electrically connected to an end of the memory string; and a control circuit. The control circuit is configured to, when performing a write operation on the memory cell array, apply a first voltage to a selected word line selected from among a plurality of the word lines, apply a second voltage which is smaller than the first voltage to an unselected word line rendered unselected from among a plurality of the word lines, and before lowering a voltage applied to the unselected word line from the second voltage to a third voltage which is smaller than the second voltage, lower a voltage applied to the selected word line from the first voltage to a fourth voltage which is smaller than the first voltage.

A nonvolatile semiconductor memory device according to embodiments will be described below with reference to the drawings.

First Embodiment

[Overall Configuration]

First, an overall configuration of a nonvolatile semiconductor memory device according to a first embodiment will be described.

Figure 1:
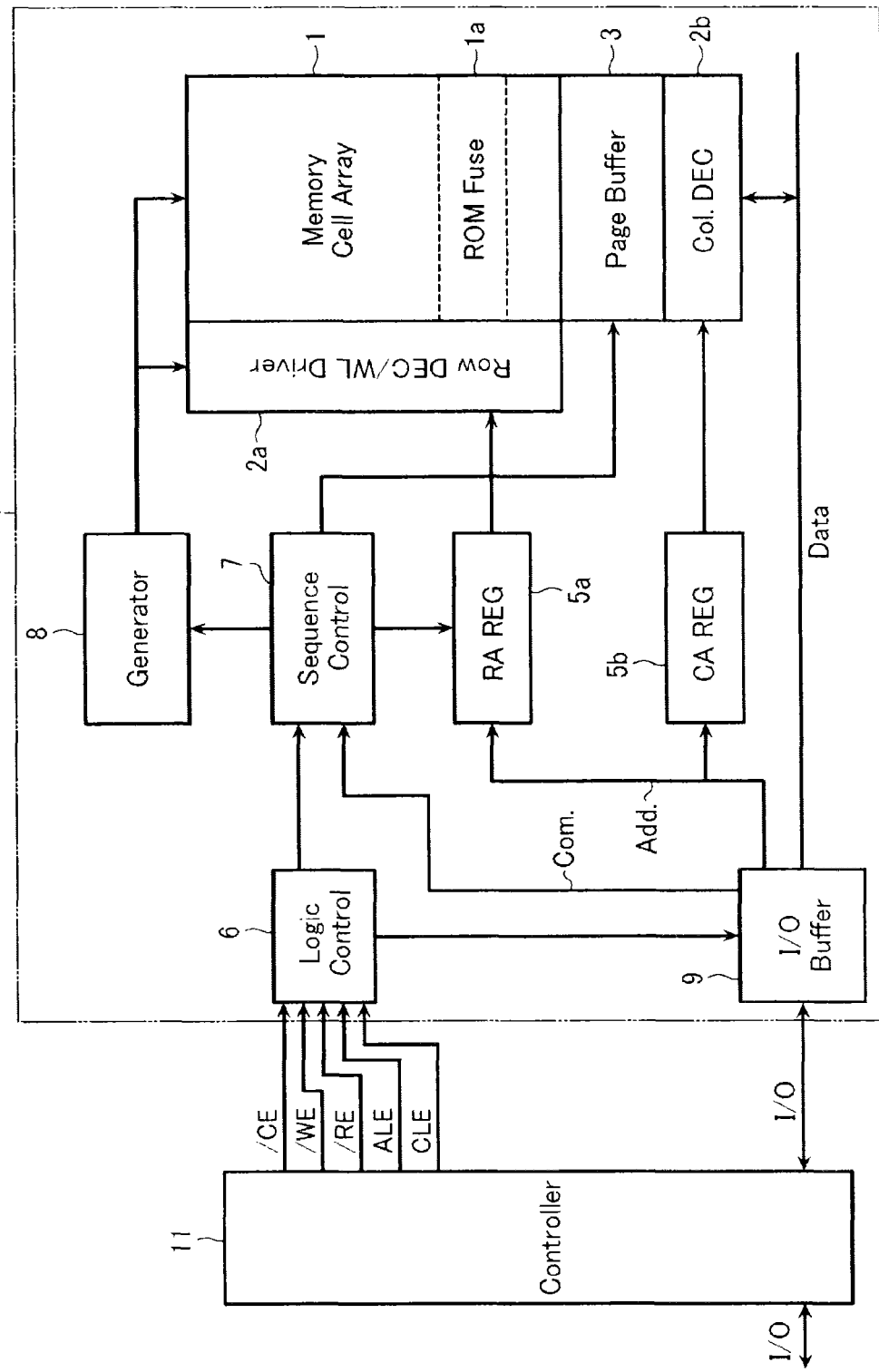
FIG. 1 is an example of a block diagram of a nonvolatile semiconductor memory device according to a first embodiment.

FIG. 1 is an example of a block diagram of the nonvolatile semiconductor memory device according to the present embodiment.

This NAND type flash memory comprises a NAND chip 10 and a controller 11 that controls this NAND chip 10.

As will be described later, a memory cell array 1 configuring the NAND chip 10 is configured having a plurality of memory cells arranged in a matrix therein, each of the memory cells including a charge accumulation layer. This memory cell array 1 may be provided with a ROM fuse region 1a inaccessible from the user, as required. Various kinds of information required in control of the device during data write, and so on, may be stored in this ROM fuse region 1a.

Disposed in a periphery of the memory cell array 1 are a row decoder/word line driver 2a, a column decoder 2b, a page buffer 3, and a voltage generating circuit 8. These row decoder/word line driver 2a, column decoder 2b, page buffer 3, and voltage generating circuit 8 configure a data write unit, and perform write or read of data in page units on the memory cell array 1.

The row decoder/word line driver 2a drives a word line and a select gate line of the memory cell array 1. The page buffer 3 includes a sense amplifier circuit and data storage circuit corresponding to one page. One-page read data of the page buffer 3 is sequentially column-selected by the column decoder 2b to be outputted to an external I/O terminal via an I/O buffer 9. Write data supplied from an I/O terminal is selected by the column decoder 2b to be loaded into the page buffer 3. One-page write data is loaded into the page buffer 3. A row address signal and a column address signal are inputted via the I/O buffer 9 and respectively transferred to the row decoder/word line driver 2a and the column decoder 2b. A row address register 5a stores an erase block address or stores a page address. A column address register 5b is inputted with a lead column address for write data load before write sequence start or with a lead column address for a read sequence. The column address register 5b stores the inputted column address until a write enable signal /WE or a read enable signal /RE is toggled by a certain condition.

A logic control circuit 6 receives a command such as a control signal of the likes of a chip enable signal /CE, a command enable signal CLE, an address latch enable signal ALE, the write enable signal /WE, and the read enable signal /RE that are transmitted from the controller 11. Input of the address and input/output of data are controlled based on this command. Moreover, on receiving the command, the logic control circuit 6 issues an instruction to a sequence control circuit 7 to perform sequence control of a read operation or of write or erase. The voltage generating circuit 8 is controlled by the sequence control circuit 7 to generate certain voltages required in various kinds of operations.

The controller 11 executes control of write and read of data by a condition appropriate to a current write state of the NAND chip 10. Note that part of the later-described write sequence may be configured to be performed on a NAND chip 10 side.

[Memory Cell Array]

Next, the memory cell array 1 of the nonvolatile semiconductor memory device according to the present embodiment will be described.

Figure 2:
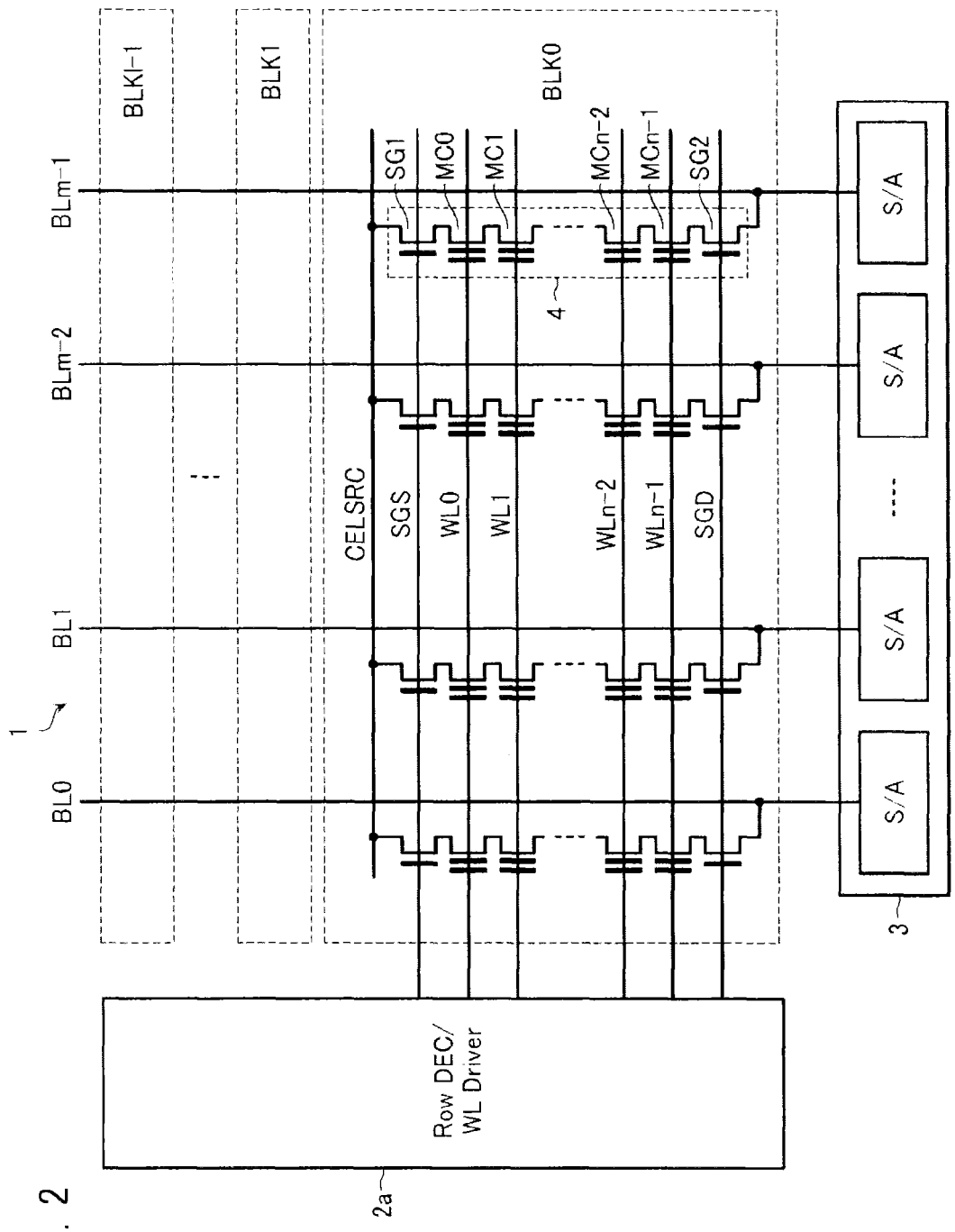
FIG. 2 is an example of a circuit diagram showing a memory cell array and a peripheral circuit of the nonvolatile semiconductor memory device according to the first embodiment.

FIG. 2 is an example of a circuit diagram of the memory cell array 1 and a peripheral circuit. In the case of FIG. 2, a NAND string 4 is configured by n (n is a natural number) series-connected memory cells MC0 to MCn−1 and select gate transistors SG1 and SG2 connected to both ends of these series-connected memory cells MC0 to MCn−1. A source of the select gate transistor SG1 is connected to a common source line CELSRC, and a drain of the select gate transistor SG2 is connected to bit lines BL (BL0 to BLm−1). Control gates of the memory cells MC0 to MCn−1 are respectively connected to word lines WL (WL0 to WLn−1), and gates of the select gate transistors SG1 and SG2 are connected to select gate lines SGS and SGD.

The plurality of memory cells MC sharing one word line WL form a page which is a unit of batch read and write of data. Moreover, the plurality of NAND strings 4 aligned in a word line WL direction configure a block BLK which is a unit of batch erase of data. In FIG. 2, a plurality of blocks BLK0 to BLK1−1 are arranged such that NAND strings 4 adjacent in a bit line BL direction share the bit line BL, thereby configuring the memory cell array 1. The word lines WL and the select gate lines SGS and SGD are driven by the row decoder 2a. Each of the bit lines BL is connected to a sense amplifier circuit S/A of the page buffer 3.

A "page" which is an access unit of this kind of NAND type flash memory will now be described. In the description below, "page" has two different meanings, hence care is required.

First, there is "page" as a data access unit configured from the plurality of memory cells MC shared by one word line. Then second, there is "page" indicating hierarchy of stored data in the case where multiple bits are stored in one memory cell. In this case, the "page" is called an "L (Lower) page", a "U (Upper) page", and so on.

[Write Sequence]

First, before describing data write of the present embodiment, terms employed hereafter will be explained in advance.

The write sequence is performed by providing a certain voltage to the word line WL, and so on, by a control circuit. Now, the control circuit refers to circuits involved in the write sequence such as the sequence control circuit 7, the row decoder/word line driver 2a, and the column decoder 2b.

First, a series of processings executed during data write is called a "write sequence". This write sequence is executed by repetition of a "write loop" configured from a "program operation" that actually causes a threshold voltage of the memory cell to undergo transition and a "verify operation" that verifies the threshold voltage of the memory cell. Each program operation is configured from one or two or more "program steps". In each program step, a program voltage required for transition of the threshold voltage of the memory cell is applied at least one time to the word line. Moreover, each of the verify operations is configured from one or two or more "verify steps". In each verify step, a detection operation of the threshold voltage of the memory cell using a certain verify voltage is executed one time.

Next, the write sequence of the present embodiment will be described.

Figure 3:
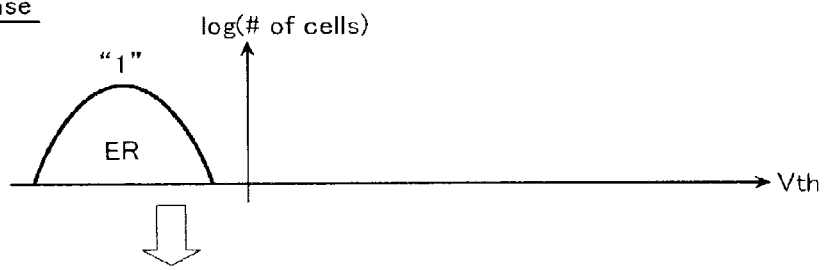
FIG. 3 is an example of a view showing threshold voltage distributions during a write operation of a memory cell of the nonvolatile semiconductor memory device according to the first embodiment.
Figure 3:
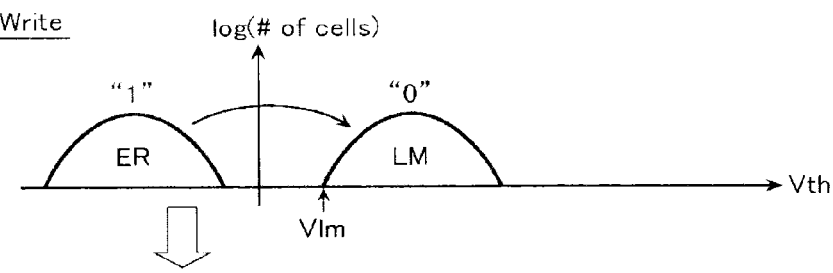
Figure 3:
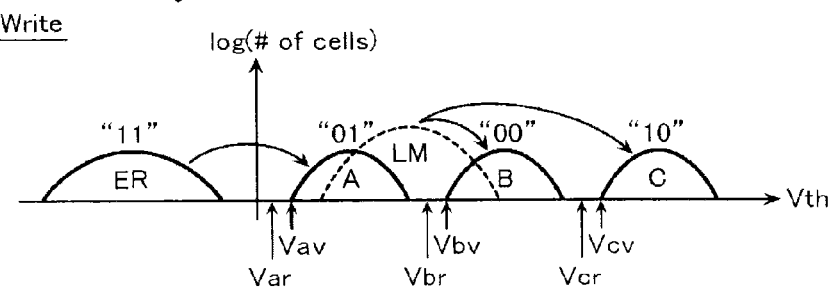

FIG. 3 is a view showing transition of threshold voltage distributions of a memory cell group during the write sequence when using a two bits/cell memory cell.

First, data erase is executed (step S101). This is executed in a batch on an entire block. As a result, a threshold voltage Vth of all of the memory cells in the block becomes a lowest ER level.

Following this, an L page write is executed (step S102). This is executed based on a lower bit of write data. When the lower bit is "1", the threshold voltage Vth of the memory cell is maintained at the ER level. When the lower bit is "0", the threshold voltage Vth of the memory cell undergoes transition from the ER level to an LM level which is an intermediate level between an A level and a B level and has a lower limit of threshold voltage distribution which is higher than a voltage Vlm.

Finally, a U page write is executed (step S103). This is executed based on an upper bit of the write data. In the case that the threshold voltage Vth of the memory cell is the ER level, and if the upper bit is "1", then the threshold voltage Vth of the memory cell is maintained unchanged at the ER level. Conversely, if the upper bit is "0", then the threshold voltage Vth of the memory cell undergoes transition to the A level which is higher than a voltage Vav (Vav<Vlm). On the other hand, in the case that the threshold voltage Vth of the memory cell is the LM level, and if the upper bit is "0", then the threshold voltage Vth of the memory cell undergoes transition to the B level which has a lower limit of threshold voltage distribution which is higher than a voltage Vbv (Vav<Vbv). Conversely, if the upper bit is "1", then the threshold voltage Vth of the memory cell undergoes transition to a C level which has a lower limit of threshold voltage distribution which is higher than a voltage Vcv (Vbv<Vcv).

As described above, write of two bit data to the memory cell is achieved in two stages, that is, the L page write and the U page write.

Write of each of the pages is achieved by repetition of the following write loop.

The write loop is configured from the program operation that causes the threshold voltage Vth of the memory cell MC to undergo transition and the verify operation that verifies that the threshold voltage Vth of the memory cell MC is a verify voltage or more.

Figure 4:
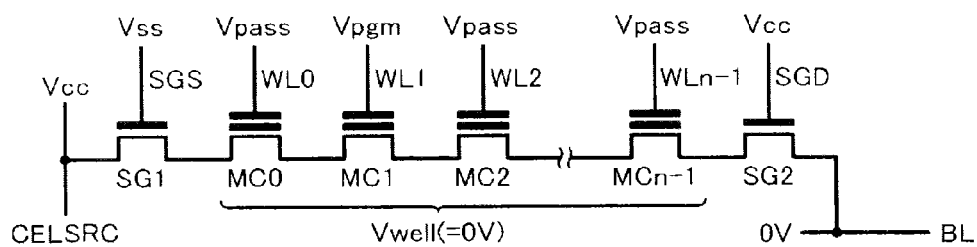
FIG. 4 is an example of a view explaining applied voltages during the write operation of the nonvolatile semiconductor memory device according to the first embodiment.

The program operation of the write sequence is achieved by setting the memory cell array 1 to a bias state shown in FIG. 4. Note that the example shown in FIG. 4 shows the case of writing data to the memory cell MC1 connected to the word line WL1.

In other words, in the program operation, a program voltage Vpgm (for example, about 14 V) required for transition of the threshold voltage Vth of the memory cell MC is applied to a control gate of the selected memory cell MC1 (word line WL1), and the control gates of the other memory cells MC0, MC2, . . . , MCn−1 are each applied with an intermediate voltage Vpass (for example, about 7 V). This intermediate voltage Vpass is a voltage of a degree whereby the memory cells MC0, MC2, . . . , MCn−1 are switched on and of a degree whereby they are not programmed. In addition, the select gate line SGS on a source line CELSRC side is applied with a ground voltage Vss (for example, 0 V), and the select gate line SGD on a bit line BL side is applied with a power supply voltage Vcc. The bit line BL is applied with 0 V. The source line CELSRC is applied with the power supply voltage Vcc. Moreover, a cell well is applied with a well voltage Vwell (for example, 0 V).

According to this, a high voltage is applied to a gate insulating film of the memory cell MC1, electrons tunnel into the charge accumulation layer from the cell well, and a charge is accumulated in the charge accumulation layer. As a result, the threshold voltage Vth of the memory cell MC1 shifts to a positive voltage side.

Figure 5:
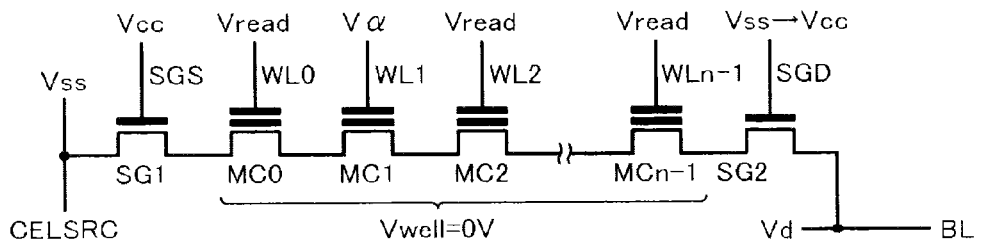
FIG. 5 is an example of a view explaining applied voltages during a read operation of the nonvolatile semiconductor memory device according to the first embodiment.

On the other hand, the verify operation of the write sequence is achieved by verify steps performed on a threshold voltage distribution basis. A bias state of the memory cell array 1 during each of the verify steps is as in FIG. 5. Note that the example shown in FIG. 5 shows the case of verifying the threshold voltage Vth of the memory cell MC1 connected to the word line WL1.

In the verify steps, a verify voltage Vα is applied to the control gate of the selected memory cell MC1 (word line WL1). The verify voltage Vα is a voltage corresponding to any of the voltages Vav, Vbv, and Vcv shown in FIG. 3. Moreover, a read pass voltage Vread (for example, about 4 V) is applied to the control gates of the unselected memory cells MC0, MC2, . . . , MCn−1, the power supply voltage Vcc is applied to the select gate line SGS, and the ground voltage Vss is applied to the select gate line SGD. The read pass voltage Vread is a voltage of a degree whereby the unselected memory cells MC0, MC2, . . . , MCn−1 are switched on and has a value which is higher than an upper limit of the uppermost threshold voltage distribution. As a result, the unselected memory cells MC0, MC2, . . . , MCn−1 are switched on. In addition, the bit line BL is pre-charged to a voltage Vd (for example, 1 V). The ground voltage Vss (for example, 0 V) is applied to the source line CELSRC. Moreover, the cell well is applied with the well voltage Vwell (for example, 0 V). After the bit line BL has been pre-charged to the voltage Vd (for example, 1 V), the select gate line SGD is applied with the power supply voltage Vcc.

As a result, if the threshold voltage Vth of the memory cell MC1 is not more than the verify voltage Vα, then the memory cell MC1 is switched on, the bit line BL and the source line CELSRC are electrically connected, and a voltage of the bit line BL that had been pre-charged by the voltage Vd lowers. Then, by detecting this bit line BL by the sense amplifier S/A included in the page buffer 3, it can be determined whether the threshold voltage Vth of the memory cell MC is not more than the verify voltage Vα.

The verify operation performs the verify steps described herein for the A level, the B level, and the C level.

The write sequence repeats the above-described write loop configured from the program operation and the verify operation, while stepping up the program voltage Vpgm.

Moreover, the read sequence is substantially similar to the above-described verify operation. In the read sequence, a reference voltage Vβ is applied to the control gate of the selected memory cell MC1 (word line WL1), instead of the verify voltage Vα. Now, in the case of a two bits/cell memory cell MC, the reference voltage Vβ includes three reference voltages, that is, reference voltages Var, Vbr, and Vcr. For example, the reference voltage Vbr is applied to the control gate of the selected memory cell MC1, then the reference voltage Var is applied to the control gate of the selected memory cell MC1. Now, if the threshold voltage Vth of the memory cell MC is smaller than the reference voltage Vbr and larger than the reference voltage Var, then the memory cell MC may be said to belong to the A level threshold voltage distribution.

[Configuration of NAND String 4]

Figure 6:
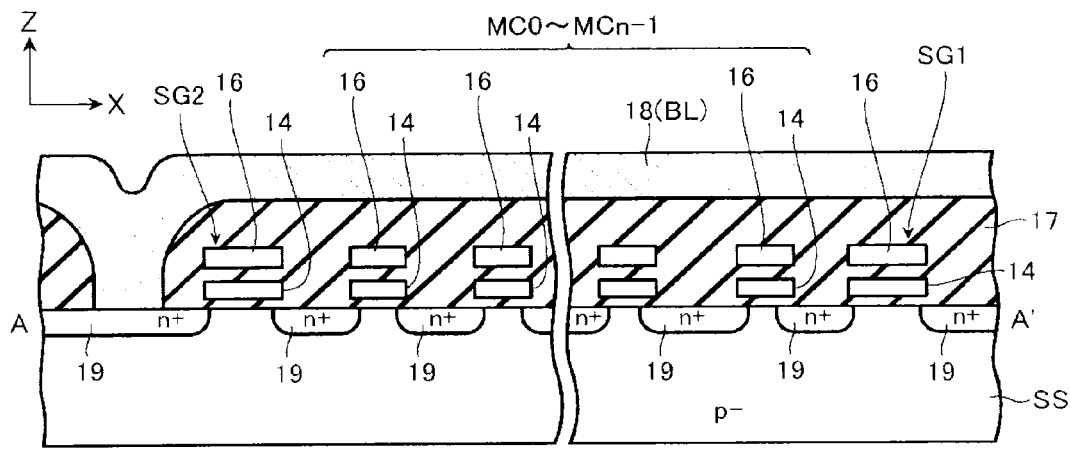
FIG. 6 is an example of a cross-sectional view showing the memory cell array of the nonvolatile semiconductor memory device according to the first embodiment.
Figure 7:
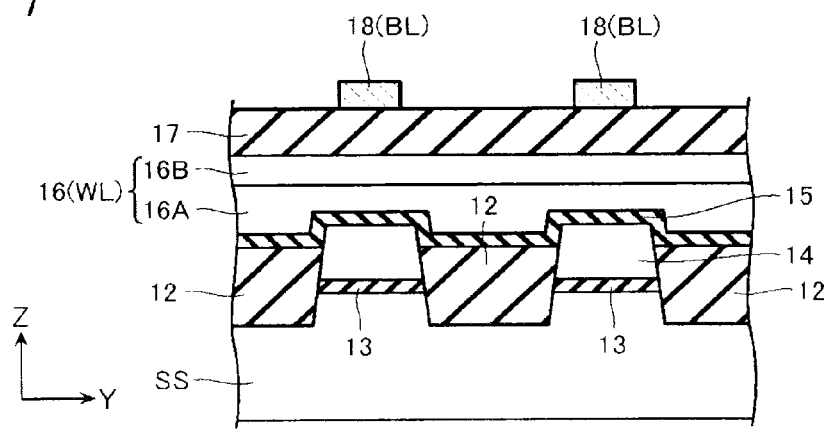
FIG. 7 is an example of a cross-sectional view showing the memory cell array of the nonvolatile semiconductor memory device according to the first embodiment.

FIGS. 6 and 7 illustrate an example of cross-sectional views showing an actual structure of the NAND string 4. FIG. 6 is a cross-sectional view of the NAND string 4 in the bit line direction, and FIG. 7 is a cross-sectional view of the NAND string 4 in the word line direction.

As shown in FIGS. 6 and 7, the memory cells MC0 to MCn−1 in one NAND string each comprise a charge accumulation layer 14 formed on a substrate SS via a gate insulating film 13. A control gate 16 is formed on this charge accumulation layer 14 via an inter-gate insulating film 15. The control gate 16 extends having as a longer direction a direction perpendicular to a plane of paper of FIG. 6, and functions as the aforementioned word line WL.

An n type diffusion layer 19 which is a source and a drain of the memory cell MC is shared by adjacent two memory cells MC or select gate transistors SG1 and SG2. Note that the select gate transistors SG1 and SG2 also similarly comprise the charge accumulation layer 14 and the control gate 16. However, the charge accumulation layer 14 and the control gate 16 of the select gate transistors SG1 and SG2 are short-circuited via a through-hole formed at a position not illustrated, thereby configuring one gate electrode.

In addition, the n type diffusion layer 19 configuring the drain of the select gate transistor SG2 is connected to the bit line BL. Moreover, although illustration thereof is omitted, the n type diffusion layer 19 configuring the source of the select gate transistor SG1 is connected to the source line CELSRC via a via wiring line not illustrated. Note that as shown in FIG. 7, the control gate 16 may be formed from a two-layer structure of a first wiring line layer 16A configured from, for example, polysilicon, and a silicide layer 16B formed in a layer above that first wiring line layer 16A. A conductive layer 18 is formed on this control gate layer 16 via an inter-layer insulating film 17, so as to extend having a Y direction as a longer direction. This conductive layer 18 functions as the above-mentioned bit line BL connected to the select gate transistor SG2.

Moreover, as shown in FIG. 7, element isolation insulating films 12 are formed on the p type silicon substrate SS with a certain spacing in the X direction. The element isolation insulating films 12 extend having the Y direction as a longer direction to isolate the p type silicon substrate SS into a plurality of semiconductor formation regions (active areas).

The NAND string is formed, having the Y direction as a longer direction, in each of these plurality of semiconductor formation regions.

[Program Operation]

Figure 8:
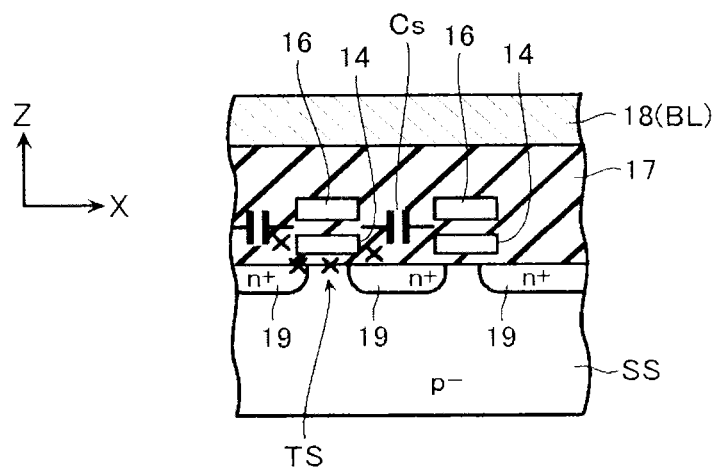
FIG. 8 is an example of a cross-sectional view showing the memory cell array of the nonvolatile semiconductor memory device according to the first embodiment.
Figure 9:
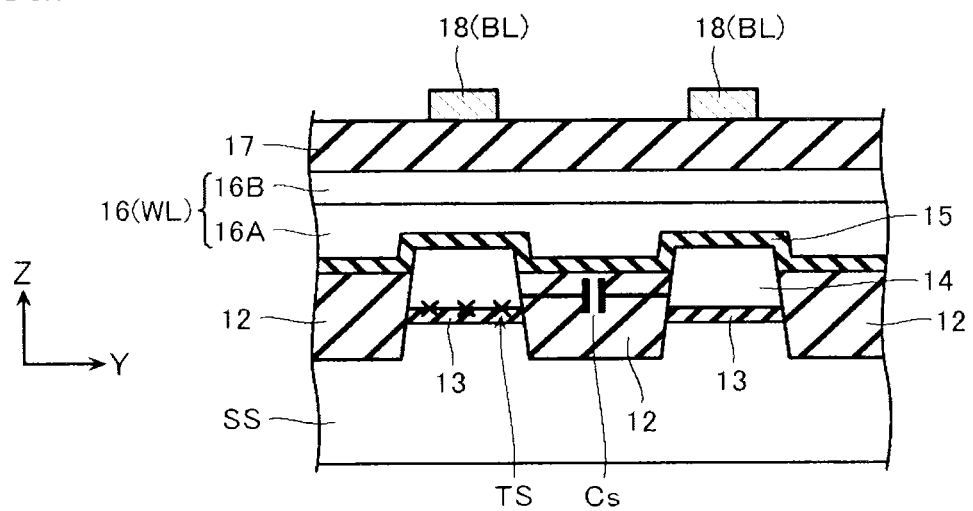
FIG. 9 is an example of a cross-sectional view showing the memory cell array of the nonvolatile semiconductor memory device according to the first embodiment.

FIGS. 8 and 9 are illustrate an example of cross-sectional views showing part of the structure of the NAND string 4. FIG. 8 is a cross-sectional view corresponding to FIG. 6, and FIG. 9 is a cross-sectional view corresponding to FIG. 7.

When the write and erase operations of the nonvolatile semiconductor memory device are repeated, a trap site TS sometimes occurs in the gate insulating film 13 in a close vicinity of the charge accumulation layer 14. When electrons are trapped in this trap site TS, the threshold voltage Vth of the memory cell MC appears to change. Therefore, when electrons are trapped in this trap site TS during the write operation, the actual threshold voltage of the memory cell MC after the write operation ends up being a different value to a desired value. Moreover, by electrons trapped in the trap site TS being released while the memory cell MC is storing data, the threshold voltage Vth of the memory cell MC during the read operation ends up being a different value to a desired value. As a result, there is a possibility that data storage characteristics of the memory cell deteriorate.

Therefore, in the nonvolatile semiconductor memory device of the present embodiment, a program operation of the kind indicated below is executed.

Figure 10:
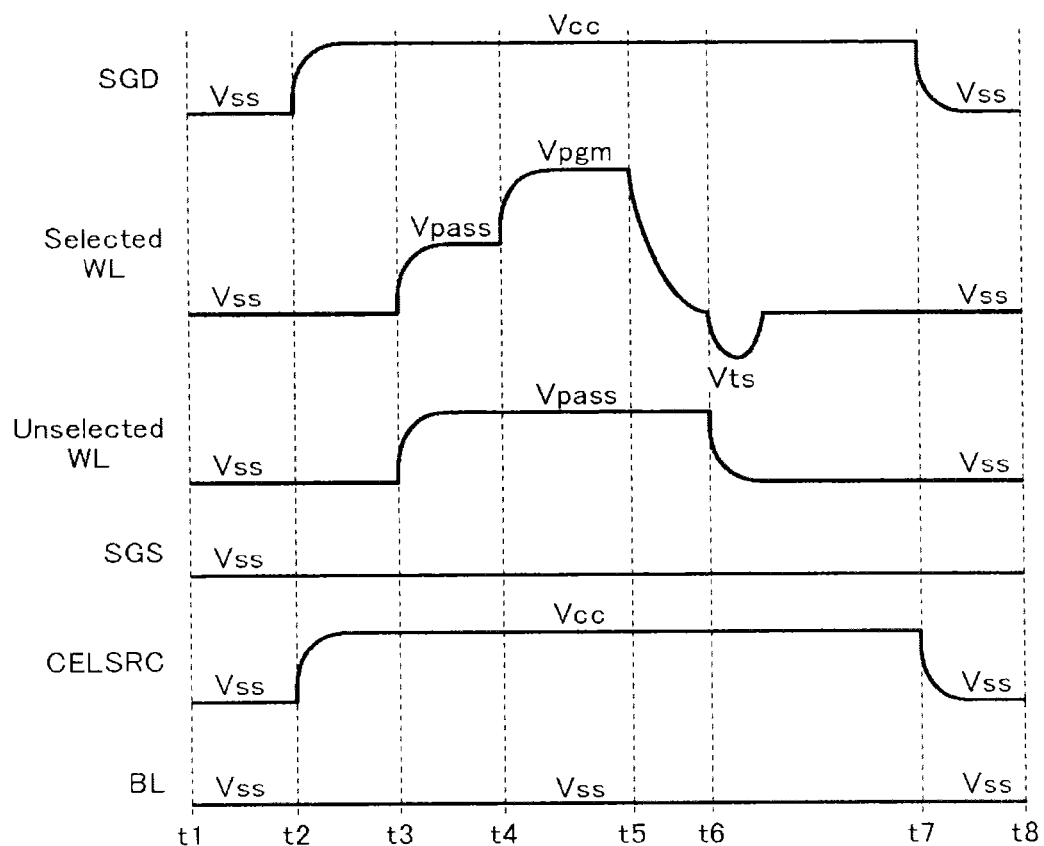
FIG. 10 is an example of an operation waveform chart of the nonvolatile semiconductor memory device according to the first embodiment.

FIG. 10 is an example of an operation waveform chart explaining the program operation of the nonvolatile semiconductor memory device according to the present embodiment. Now, description relates to the case of changing the threshold voltage of the selected memory cell MC (the case of accumulating a charge in the charge accumulation layer 14).

As shown in FIG. 10, at time t1, the control circuit provides the ground voltage Vss to the bit line BL and the select gate line SGS. At time t2, the control gate applies the power supply voltage Vcc to the select gate line SGD and the common source line CELSRC.

Next, at time t3, the control circuit applies the intermediate voltage Vpass (for example, about 7 V) to both the selected word line WL and the unselected word line WL. As a result, the ground voltage Vss is transferred to the silicon substrate SS under the charge accumulation layer 14 of the selected memory cell MC. Then, at time t4, the control circuit applies the program voltage Vpgm (for example, about 14 V) to the selected word line WL. As a result, a charge is injected into the charge accumulation layer 14 of the selected memory cell MC. At this time, electrons are injected into the charge accumulation layer 14 of the selected memory cell MC, but if a trap site TS occurs in the gate insulating film 13, electrons are trapped also in this trap site.

Next, at time t5, the control circuit lowers the voltage of the selected word line WL. At this time, the voltage of the selected word line WL is set to a value which is smaller than the intermediate voltage Vpass applied to the unselected word line WL. In the present embodiment, the voltage of the selected word line WL lowers to the ground voltage Vss.

Next, at time t6, the voltage of the unselected word line WL is lowered from the intermediate voltage Vpass to the ground voltage Vss. At this time, as shown in FIGS. 8 and 9, the word lines WL connected to the control gates 16 of the memory cells MC are extremely close to each other, hence a coupling capacitance Cs occurs. When the voltage applied to the unselected word line WL of the unselected memory cell MC peripheral to the selected word line WL has lowered, the voltage of the selected word line WL lowers due to the influence of this coupling capacitance Cs. Therefore, as shown at time t6 of FIG. 10, the voltage of the selected word line WL lowers even further than the ground voltage Vss. After reaching a negative voltage Vts due to the influence of the coupling capacitance Cs, the voltage of the selected word line WL recovers to the ground voltage Vss, because the control circuit is applying the ground voltage Vss to the selected word line Vss. The voltage of the selected word line WL returns to the ground voltage Vss after the voltage of the unselected word line WL has reached the ground voltage Vss and before time t7 is reached.

Next, at time t7, the control circuit lowers the voltage of the select gate line SGD and the common source line CELSRC. Then, at time t8, when all wiring lines have reached the ground voltage Vss, the program operation finishes.

[Advantages]

In the nonvolatile semiconductor memory device according to the present embodiment, time t5 when the voltage of the selected word line WL is lowered and time t6 when the voltage of the unselected word line WL is lowered after the program operation, are made different. In addition, the control circuit lowers the voltage of the unselected word line WL immediately after setting the voltage of the selected word line WL to the ground voltage Vss. Now, when the voltage applied to the unselected word line WL has lowered, the voltage of the selected word line WL lowers due to the influence of the coupling capacitance Cs. Therefore, as shown at time t6 of FIG. 10, the voltage of the selected word line WL lowers further than the ground voltage Vss. At this time, the selected memory cell MC is applied with a voltage (weak erase voltage) which is the reverse of that during the program operation. Due to this weak erase voltage, electrons trapped in the trap site TS in a periphery of the selected memory cell MC are released to the silicon substrate SS.

As a result, the threshold voltage Vth of the selected memory cell MC achieves a value based on electrons trapped in the charge accumulation layer 14. Electrons trapped in the trap site TS are not released while data is being stored in the memory cell MC, and the threshold voltage Vth of the memory cell MC never changes from a desired value. It therefore becomes possible for the verify operation to be accurately executed in the verify steps, and for data storage characteristics of the memory cell to be favorably maintained.

In addition, since the program operation finishes in a state where electrons are released from the trap site TS in a close vicinity of the charge accumulation layer 14, reduction of a cell current caused by electrons trapped in the trap site TS can be suppressed. Moreover, the threshold value Vth of the selected memory cell MC can be controlled in a state where the influence of electrons trapped in the trap site TS has been eliminated, hence a threshold voltage distribution after the program operation can be controlled such that a width of the threshold voltage distribution after the program operation narrows.

Even in the case where the weak erase voltage is applied to the entire well to execute an operation causing electrons to be released from the trap site TS, there is a chance that the threshold voltage of the unselected memory cell MC connected to the unselected word line WL also gets affected. The nonvolatile semiconductor memory device according to the present embodiment makes it possible to lower only the voltage of the selected word line WL immediately after it has been applied with the program voltage Vpgm. Since only the selected word line WL is applied with the weak erase voltage, it is possible to control only the threshold voltage Vth of the selected memory cell MC. Moreover, it is made possible for the weak erase voltage to be applied to the entire well to execute the operation causing electrons to be released from the trap site TS, in a shorter time.

Second Embodiment

Next, a second embodiment of the present invention will be described with reference to FIG. 11. An overall configuration of the nonvolatile semiconductor memory device of the second embodiment is similar to that of the first embodiment, and a detailed description thereof will be omitted. Moreover, places having a similar configuration to those in the first embodiment are assigned with identical reference symbols, and a duplicated description of such places will be omitted.

In the program operation of the present embodiment, the voltage of the unselected word line WL is maintained at, for example, the intermediate voltage Vpass for a certain period even after the voltage of the selected word line WL has lowered from the program voltage Vpgm to the ground voltage Vss. The program operation of the nonvolatile semiconductor memory device according to the present embodiment will be described be low with reference to FIG. 11.

[Program Operation]

Figure 11:
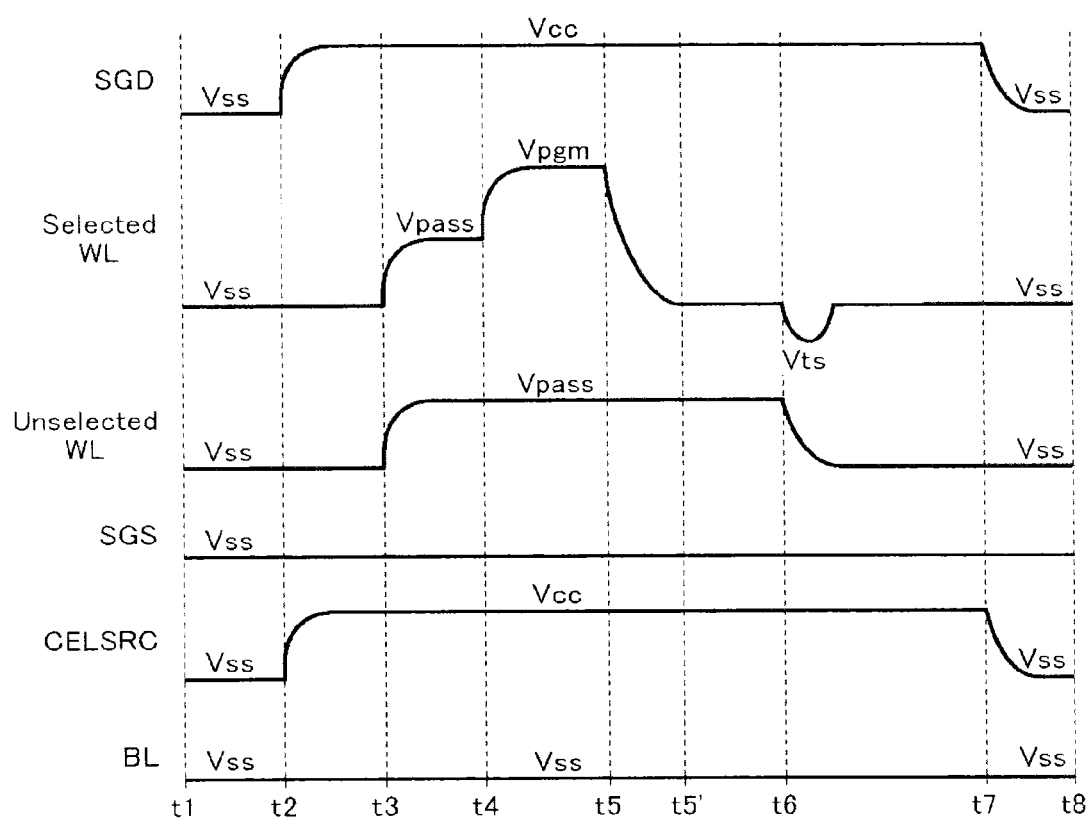
FIG. 11 is an example of an operation waveform chart of a nonvolatile semiconductor memory device according to a second embodiment.

FIG. 11 is an example of an operation waveform chart explaining the program operation of the nonvolatile semiconductor memory device according to the present embodiment. Now, description relates to the case of changing the threshold voltage of the selected memory cell MC (the case of accumulating a charge in the charge accumulation layer 14).

The program operation of the present embodiment shown in FIG. 11 is a similar operation to the program operation of the first embodiment shown in FIG. 10 from time t1 to time t4.

As shown in FIG. 11, at time t5, the voltage of the selected word line WL is lowered. At this time, the voltage of the selected word line WL is set to a value which is smaller than the intermediate voltage Vpass applied to the unselected word line WL. In the present embodiment, at time t5', the voltage of the selected word line WL is lowered to the ground voltage Vss. After this, from time t5' to time t6, the unselected word line WL is held unchanged in a state of being applied with the intermediate voltage Vpass.

From subsequent time t6 to time t8, the operation is similar to the program operation of the first embodiment shown in FIG. 10.

[Advantages]

The nonvolatile semiconductor memory device according to the present embodiment also enables similar advantages to those of the first embodiment to be obtained.

Moreover, in the nonvolatile semiconductor memory device according to the present embodiment, the unselected word line WL is held unchanged in a state of being applied with the intermediate voltage Vpass, from time t5' to time t6. As a result, in this period from time t5' to time t6, a voltage is applied in a transverse direction (for example, an X direction shown in FIG. 8) from the selected memory cell MC to an adjacent unselected memory cell MC. In this case also, electrons are released from the trap site TS formed in the periphery of the charge accumulation layer 14. As a result, the threshold voltage Vth of the memory cell MC never changes from a desired value due to electrons trapped in the trap site TS, and it becomes possible for data storage characteristics of the memory cell to be favorably maintained.

Third Embodiment

Next, a third embodiment of the present invention will be described with reference to FIGS. 12 and 13. An overall configuration of the nonvolatile semiconductor memory device of the third embodiment is similar to that of the first embodiment, and a detailed description thereof will be omitted. Moreover, places having a similar configuration to those in the first embodiment are assigned with identical reference symbols, and a duplicated description of such places will be omitted.

In the program operation of the present embodiment, the control circuit raises the voltage of the unselected word line WL adjacent to the selected word line WL, after the voltage of the selected word line WL has begun to lower. The program operation of the nonvolatile semiconductor memory device according to the present embodiment will be described below with reference to FIGS. 12 and 13.

[Program Operation]

Figure 12:
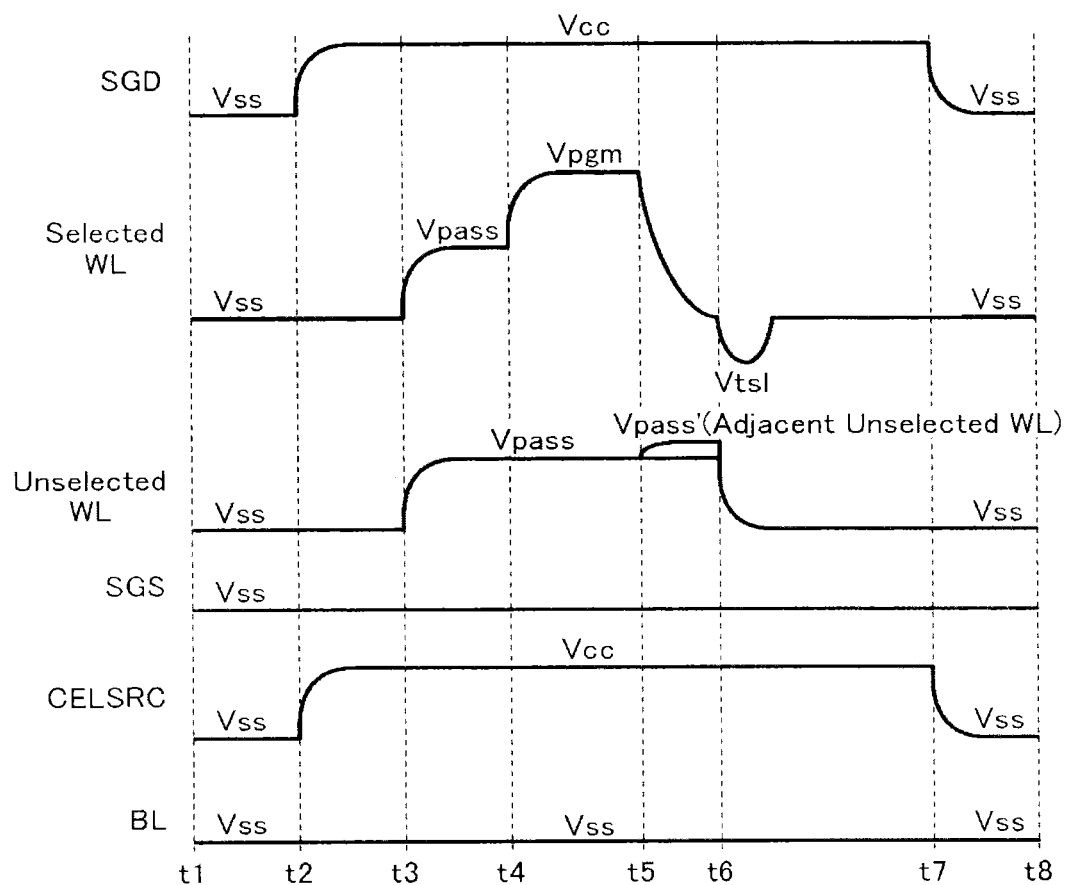
FIG. 12 is an example of an operation waveform chart of a nonvolatile semiconductor memory device according to a third embodiment.
Figure 13:
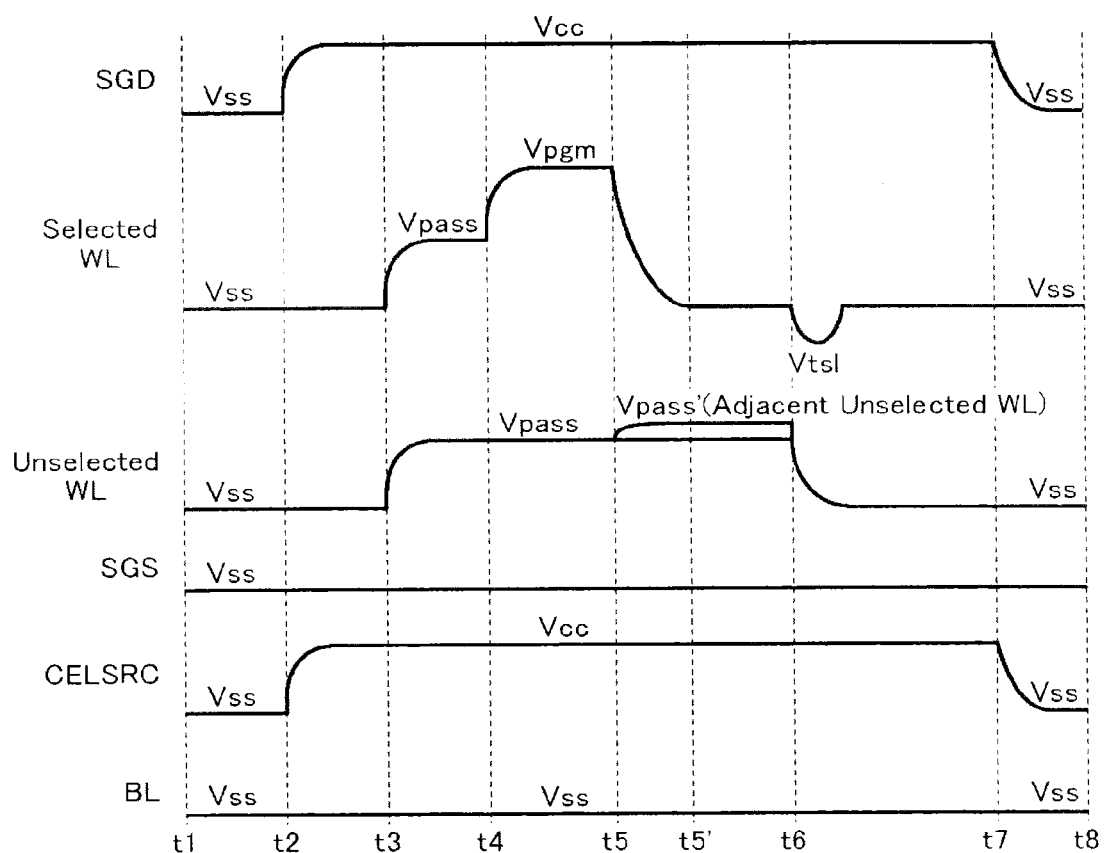
FIG. 13 is an example of an operation waveform chart of the nonvolatile semiconductor memory device according to the third embodiment.

FIGS. 12 and 13 illustrate an example of an operation waveform chart explaining the program operation of the nonvolatile semiconductor memory device according to the present embodiment. FIG. 12 corresponds to the program operation of the first embodiment, and FIG. 13 corresponds to the program operation of the second embodiment.

The program operations of the present embodiment shown in FIGS. 12 and 13 are similar operations to the program operations of the first and second embodiments shown in FIGS. 10 and 11, besides an intermediate voltage Vpass' being applied to those of the unselected word lines WL that are adjacent to the selected word line WL. As shown in FIGS. 12 and 13, at time t5, the voltage of the selected word line WL begins to lower. At this time, the voltage of the unselected word line WL adjacent to the selected word line WL in an X direction shown in FIG. 6 is set to the intermediate voltage Vpass' which is larger than the intermediate voltage Vpass and smaller than the program voltage Vpgm.

Note that it is possible to set to the intermediate voltage Vpass' the unselected word line WL adjacent only on a bit line side to the selected word line WL in the X direction shown in FIG. 6. It is also possible to set to the intermediate voltage Vpass' the unselected word line WL adjacent only on a source line side to the selected word line WL in the X direction shown in FIG. 6. Moreover, it is also possible to set to the intermediate voltage Vpass' the two unselected word lines WL adjacent to the selected word line WL in the X direction shown in FIG. 6.

[Advantages]

The nonvolatile semiconductor memory device according to the present embodiment also enables similar advantages to those of the first and second embodiments to be obtained.

Moreover, in the nonvolatile semiconductor memory device according to the present embodiment, the unselected word line WL adjacent to the selected word line WL is applied with the intermediate voltage Vpass' at time t5 of FIGS. 12 and 13. The larger the intermediate voltage Vpass' applied to the adjacent unselected word line WL, the larger becomes the voltage of the selected word line WL that lowers due to the coupling capacitance Cs when the voltage of the adjacent unselected word line WL lowers. That is, the voltage of the selected word line WL can be set to a negative voltage Vts1 which is smaller than the negative voltage Vts. Moreover, the larger the intermediate voltage Vpass' applied to the adjacent unselected word line WL, the larger becomes the voltage applied to the selected memory cell MC in the period from time t5' to time t6 of FIG. 13. As a result, electrons can be released from the trap site TS formed in the periphery of the charge accumulation layer 14 more reliably.

Fourth Embodiment

Next, a fourth embodiment of the present invention will be described with reference to FIG. 14. An overall configuration of the nonvolatile semiconductor memory device of the fourth embodiment is similar to that of the first embodiment, and a detailed description thereof will be omitted. Moreover, places having a similar configuration to those in the first embodiment are assigned with identical reference symbols, and a duplicated description of such places will be omitted.

The present embodiment differs from the above-described embodiments in the description of the verify operation. The verify operation of the nonvolatile semiconductor memory device according to the present embodiment will be described below with reference to FIG. 14.

[Verify Operation]

Figure 14:
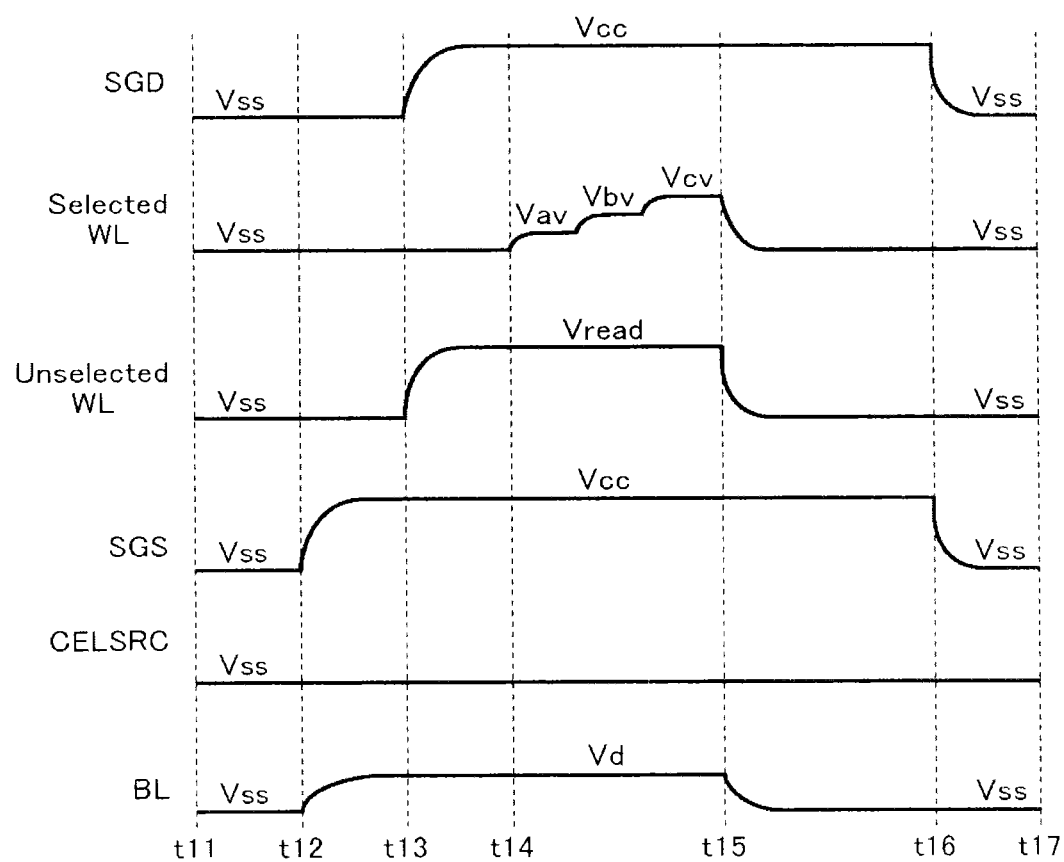
FIG. 14 is an example of an operation waveform chart of a nonvolatile semiconductor memory device according to a fourth embodiment.

FIG. 14 is an example of an operation waveform chart explaining the verify operation of the nonvolatile semiconductor memory device according to the present embodiment.

As shown in FIG. 14, at time t11, the control circuit sets all wiring lines to the ground voltage Vss. Then, at time t12, the control circuit applies the power supply voltage Vcc to the select gate line SGS. Additionally at time t12, the control circuit applies a voltage Vd (for example, 1 V) to the bit line BL. As a result, the bit line BL is charged to the voltage Vd. Next, at time t13, the control circuit applies the power supply voltage Vcc to the select gate line SGD. Additionally at time t13, the control circuit applies the read pass voltage Vread (for example, about 4 V) to the unselected word line WL.

Next, at time t14 after a certain time has elapsed, the verify voltage Vα is applied to the selected word line WL. The verify voltage Vα is a voltage corresponding to any of the voltages Vav, Vbv, and Vcv shown in FIG. 3. At this time, it is determined whether data is written accurately in the memory cell MC based on whether the selected memory cell MC is conductive or not.

Next, at time t15, the control circuit lowers the voltages of the selected word line WL and the unselected word line WL. At this time, the control circuit lowers the voltage of the bit line BL. Next, at time t16, the control circuit lowers the voltages of the select gate lines SGS and SGD. Then, at time t17, when all of the wiring lines have reached the ground voltage Vss, the verify operation finishes.

[Advantages]

In the nonvolatile semiconductor memory device according to the present embodiment, electrons are released from the trap site TS in the periphery of the selected memory cell MC, before the verify operation of the selected memory cell MC is executed. In the nonvolatile semiconductor memory device according to the present embodiment, the unselected word line WL is maintained unchanged in a state of being applied with the read pass voltage Vread, from time t13 to time t14 of FIG. 14. As a result, in this period from time t13 to time t14, a voltage is applied in a transverse direction (for example, an X direction shown in FIG. 8) from the selected memory cell MC to an adjacent unselected memory cell MC.

In this case, electrons are released from the trap site TS formed in the periphery of the charge accumulation layer 14. As a result, the threshold voltage Vth of the memory cell MC never changes from a desired value due to electrons trapped in the trap site TS, and it becomes possible for the verify operation of the selected memory cell MC to be accurately executed.

[Other]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, the program operation of the above-described embodiments may be applied to both the case of an L page write and the case of a U page write. In addition, the program operation of the above-described embodiments may also be applied only to either one of the case of the L page write and the case of the U page write. For example, the program operation of the above-described embodiments may be executed only in the case of the L page write.

Moreover, in the embodiments shown in FIGS. 11 and 13, it is also possible to set the voltages of the two unselected word lines WL adjacent to the selected word line WL to voltages that differ from each other. In the embodiments shown in FIGS. 11 and 13, electrons are released in a transverse direction of the selected memory cell MC, in the period from time t5' to time t6. In the case of executing the write operation in order from the memory cells MC on a common source line CELSRC side to the memory cells MC on a bit line BL side of the NAND string 4, it is undesirable that electrons are released toward the memory cells MC whose write operation has already finished. Therefore, in the embodiments shown in FIGS. 11 and 13, by setting the voltages of the two unselected word lines WL adjacent to the selected word line WL to voltages that differ from each other, it is made possible also to control such that electrons are released toward the memory cells MC on the bit line BL side (memory cells MC on which the program operation has not yet been executed).

Note that configurations below may be employed in each of the embodiments related to the present invention.

(1) Read Operation

The voltage applied to the word line WL selected during the read operation of the A level is, for example, in a range of 0 V to 0.55 V. However, said voltage is not limited to this range, and the voltage applied to the selected word line WL during the read operation of the A level may be set in any of ranges of 0.1 V to 0.24 V, 0.21 V to 0.31 V, 0.31 V to 0.4 V, 0.4 V to 0.5 V, and 0.5 V to 0.55 V.

The voltage applied to the word line WL selected during the read operation of the B level is, for example, in a range of 1.5 V to 2.3 V. However, said voltage is not limited to this range, and the voltage applied to the selected word line WL during the read operation of the B level may be set in any of ranges of 1.65 V to 1.8 V, 1.8 V to 1.95 V, 1.95 V to 2.1 V, and 2.1 V to 2.3 V.

The voltage applied to the word line WL selected during the read operation of the C level is, for example, in a range of 3.0 V to 4.0 V. However, said voltage is not limited to this range, and the voltage applied to the selected word line WL during the read operation of the C level may be set in any of ranges of 3.0 V to 3.2 V, 3.2 V to 3.4 V, 3.4 V to 3.5 V, 3.5 V to 3.6 V, and 3.6 V to 4.0 V.

A time (tR) of the read operation may be set in, for example, ranges of 25 μs to 38 μs, 38 μs to 70 μs, and 70 μs to 80 μs.

(2) Program Operation

As described above, the write operation includes the program operation and the verify operation.

The program voltage Vpgm initially applied to the word line WL selected during the program operation may be set in, for example, a range of 13.7 V to 14.3 V. However, said voltage is not limited to this range, and the voltage applied to the selected word line WL during the program operation may be set in, for example, any of ranges of 13.7 V to 14.0 V and 14.0 V to 14.6 V.

The voltage initially applied to the selected word line WL when performing the write operation on an odd-numbered word line WL and the voltage initially applied to the selected word line WL when performing the write operation on an even-numbered word line WL, may be different.

The program operation may adopt an ISPP (Incremental Step Pulse Program) system. When using the ISPP system, a step-up voltage during step-up may be set to, for example, about 0.5 V.

The voltage applied to the unselected word line WL may be set in, for example, a range of 6.0 V to 7.3 V. However, said voltage is not limited to this range, and the voltage applied to the unselected word line WL may be set in, for example, a range of 7.3 V to 8.4 V, or may be set to 6.0 V or less. An applied pulse voltage may be changed based on whether the unselected word line WL is an odd-numbered word line WL or is an even-numbered word line WL. A time (tProg) of the write operation may be set in, for example, ranges of 1700 μs to 1800 μs, 1800 μs to 1900 μs, and 1900 μs to 2000 μs.

(3) Erase Operation

The voltage initially applied to the semiconductor substrate or to the well formed in an upper portion of the semiconductor substrate is, for example, in a range of 12 V to 13.6 V. However, said voltage is not limited to this range, and the voltage during the erase operation may be, for example, in ranges of 13.6 V to 14.8 V, 14.8 V to 19.0 V, 19.0 V to 19.8 V, and 19.8 V to 21 V. A time (tErase) during the erase operation may be set in, for example, ranges of 3000 μs to 4000 μs, 4000 μs to 5000 μs, and 4000 μs to 9000 μs.

(4) Structure of Memory Cell

The memory cell MC includes the charge accumulation layer disposed on the semiconductor substrate (silicon substrate) via the tunnel insulating film. This charge accumulation layer may adopt a stacked structure of an insulating film of the likes of SiN or SiON and polysilicon. Moreover, a metal such as Ru may be added to the conductive film. The insulating film is included on the charge accumulation layer. This insulating film includes, for example, a silicon oxide film sandwiched by High-K films. The control electrode is formed on the insulating film via a material for work function adjustment. Now, the material for work function adjustment is a metal oxide film of the likes of TaO and a metal nitride film of the likes of TaN. The control electrode may employ W or the like.

In addition, an air gap may be formed between the memory cells MC.

What is claimed is:

1. A nonvolatile semiconductor memory device, comprising:
    a memory cell array including a memory string having a plurality of memory transistors connected in series therein;
    a plurality of word lines disposed to be connected to an end of the memory string; and
    a control circuit,
    the control circuit being configured to, when performing a write operation on the memory cell array,
    apply a first voltage to a selected word line selected from among a plurality of the word lines,
    lower a voltage applied to the selected word line from the first voltage to a fourth voltage which is smaller than the first voltage at a first timing, and
    lower a voltage applied to a unselected word line from a second voltage to a third voltage which is smaller than the second voltage at a second timing, thereby lowering the fourth voltage to a fifth voltage which is smaller than the fourth voltage due to capacitive coupling.

2. The nonvolatile semiconductor memory device according to claim 1,
    wherein
    the fourth voltage is smaller than the second voltage.

3. The nonvolatile semiconductor memory device according to claim 1, wherein
    the fourth voltage is a ground voltage.

4. The nonvolatile semiconductor memory device according to claim 1, wherein
    the control circuit is configured to, after a certain time has passed after the voltage applied to the selected word line has been set to the fourth voltage, begin to lower the voltage applied to the unselected word line to the third voltage.

5. The nonvolatile semiconductor memory device according to claim 1, wherein
    the control circuit is configured to, before lowering the voltage applied to the unselected word line from the second voltage to the third voltage, raise a voltage applied to an adjacent unselected word line adjacent to the selected word line from the second voltage to a sixth voltage which is larger than the second voltage.

6. The nonvolatile semiconductor memory device according to claim 5, wherein
    The sixth voltage is smaller than the first voltage.

7. The nonvolatile semiconductor memory device according to claim 1, wherein
    the control circuit is configured to, when performing a verify operation that verifies a threshold voltage of the memory transistor after the write operation,
    at a first time, raise the voltage applied to the unselected word line from a seventh voltage to an eighth voltage which is larger than the seventh voltage and is capable of rendering conductive the memory transistor regardless of stored data of the memory transistor, and
    at a second time later than the first time, raise the voltage applied to the selected word line from a ninth voltage to a tenth voltage which is larger than the ninth voltage and is a voltage between an upper limit and a lower limit of a plurality of threshold voltage distributions provided to the memory transistor.

8. A control method of a nonvolatile semiconductor memory device, the nonvolatile semiconductor memory device comprising: a memory cell array including a memory string having a plurality of memory transistors connected in series therein; a plurality of word lines disposed to be connected to the memory transistors in the memory string; and a plurality of bit lines electrically connected to an end of the memory string, the control method comprising:
    when performing a write operation on the memory cell array,
    applying a first voltage to a selected word line selected from among a plurality of the word lines;
    applying a second voltage which is smaller than the first voltage to an unselected word line rendered unselected from among a plurality of the word lines; and
    before lowering a voltage applied to the unselected word line from the second voltage to a third voltage which is smaller than the second voltage,
    lowering a voltage applied to the selected word line from the first voltage to a fourth voltage which is smaller than the first voltage, thereby lowering the fourth voltage to a fifth voltage which is smaller than the fourth voltage due to capacitive coupling.

9. The control method of a nonvolatile semiconductor memory device according to claim 8, wherein
the fourth voltage is smaller than the second voltage.

10. The control method of a nonvolatile semiconductor memory device according to claim 8, wherein
the fourth voltage is a ground voltage.

11. The control method of a nonvolatile semiconductor memory device according to claim 8, further comprising,
after a certain time has passed after the voltage applied to the selected word line has been set to the fourth voltage, beginning to lower the voltage applied to the unselected word line to the third voltage.

12. The control method of a nonvolatile semiconductor memory device according to claim 8, further comprising,
before lowering the voltage applied to the unselected word line from the second voltage to the third voltage, raising a voltage applied to an adjacent unselected word line adjacent to the selected word line from the second voltage to a sixth voltage which is larger than the second voltage.

13. The control method of a nonvolatile semiconductor memory device according to claim 12, wherein
the sixth voltage is smaller than the first voltage.

14. The control method of a nonvolatile semiconductor memory device according to claim 8, further comprising,
when performing a verify operation that verifies a threshold voltage of the memory transistor after the write operation,
at a first time, raising the voltage applied to the unselected word line from a seventh voltage to an eighth voltage which is larger than the seventh voltage and is capable of rendering conductive the memory transistor regardless of stored data of the memory transistor, and
at a second time later than the first time, raising the voltage applied to the selected word line from a ninth voltage to a tenth voltage which is larger than the ninth voltage and is a voltage between an upper limit and a lower limit of a plurality of threshold voltage distributions provided to the memory transistor.

\* \* \* \* \*